United States Patent
Lu et al.

(10) Patent No.: US 6,372,647 B1
(45) Date of Patent: Apr. 16, 2002

(54) VIA MASKED LINE FIRST DUAL DAMASCENE

(75) Inventors: Andrew Lu, Beacon, NY (US); Juan Alexander Chediak, Berkeley, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/460,870

(22) Filed: Dec. 14, 1999

(51) Int. Cl.⁷ .............................................. H01L 21/302
(52) U.S. Cl. .................... 438/689; 438/738; 438/638
(58) Field of Search .................... 438/637, 638, 438/639, 624, 738, 689

(56) References Cited

U.S. PATENT DOCUMENTS

| | | | |
|---|---|---|---|
| 3,740,280 A | 6/1973 | Ronen | 156/11 |
| 4,040,891 A | 8/1977 | Chang et al. | 156/651 |
| 5,126,006 A | 6/1992 | Cronin et al. | 156/643 |
| 5,635,423 A | 6/1997 | Huang et al. | 437/195 |
| 5,663,101 A * | 9/1997 | Cronin | 438/637 |
| 5,686,354 A | 11/1997 | Avanzino et al. | 437/190 |
| 5,691,238 A | 11/1997 | Avanzino et al. | 437/195 |
| 5,705,430 A | 1/1998 | Avanzino et al. | 437/195 |
| 5,741,626 A * | 4/1998 | Jain et al. | 430/314 |
| 5,753,417 A * | 5/1998 | Ulrich | 430/312 |
| 5,759,744 A * | 6/1998 | Brueck et al. | 430/312 |
| 5,795,823 A | 8/1998 | Avanzino et al. | 438/639 |
| 5,818,110 A | 10/1998 | Cronin | 257/775 |
| 5,851,915 A * | 12/1998 | Miyakawa | 438/622 |
| 5,877,076 A | 3/1999 | Dai | 438/597 |
| 5,882,996 A * | 3/1999 | Dai | 438/597 |
| 5,981,149 A * | 11/1999 | Yamaguchi | 430/316 |
| 5,985,753 A * | 11/1999 | Yu et al. | 438/637 |
| 6,011,611 A * | 1/2000 | Nomura et al. | 355/67 |
| 6,180,514 B1 * | 1/2001 | Yeh et al. | 438/633 |

FOREIGN PATENT DOCUMENTS

| | | | | |
|---|---|---|---|---|
| GB | 2171221 A | * | 8/1986 | G03C/5/04 |

* cited by examiner

*Primary Examiner*—Matthew Smith
*Assistant Examiner*—Renzo N. Rocchegiani
(74) *Attorney, Agent, or Firm*—Tiffany L. Townsend

(57) ABSTRACT

A method of forming a dual damascene pattern in a dielectric, includes etching a pattern of lines minus vias overlapping the lines to a line depth, leaving the dielectric unetched at the via locations; while the vias are etched in a separate step, starting from the top surface of the dielectric and continuing to a via depth greater than the line depth.

5 Claims, 3 Drawing Sheets

VIA MASKED LINE FIRST DUAL DAMASCENE

FIELD OF THE INVENTION

This invention is related to the field of dual damascene semiconductor processing in general and more particularly to a method and mask for line first dual damascene processing.

BACKGROUND

An important part of the fabrication of very large scale integrated circuits is the formation of vias and other conductive interconnections between the various circuit elements. In the line first damascene process, the substrate surface, including transistors and other devices formed on the wafer, is first covered with a dielectric layer such as oxide. A patterned photoresist profile is then formed on the surface of the dielectric. The resist profile has openings, or holes, in the photoresist corresponding to the areas where interconnect lines are to be formed in the dielectric. Other areas of the resist are formed into openings to create vias. The areas where the lines and vias overlap are also openings. The photoresist-covered dielectric layer is then etched to remove oxide underlying the opening in the photoresist which form the lines. A second etch using a second mask to remove the oxide remaining between the bottom of the lines and the layer below to create the vias. The photoresist is then stripped away.

Production of integrated circuits using the damascene process involves high-resolution photolithography to create ultra-thin lines and vias in the dielectric. Patterns of openings are formed in the overlying positive photosensitive resist (hereinafter "photoresist" or "resist") by directing the desired patterns of light onto the photoresist, the light being of a wavelength to which the photoresist is sensitive. Subsequently, the photoresist is "developed" to remove the light-exposed areas, leaving behind a photoresist mask on the surface of the dielectric. The photoresist mask is then used as a pattern in subsequent etching of the underlying dielectric. A similar process giving a mirror effect occurs when using a negative photoresist. Examples of a mask for the lines, 100, and the mask for the vias, 105 in a line first patterning are shown in FIG. 5a and 5b, respectively. Notice that the areas where the lines and vias overlap, 110, in FIG. 5a, shown as dotted lines, are openings on both masks. For convenience in the claims, the areas where the lines and vias overlap will be referred to as the intersection of a set of lines and a set of vias, since the intersection of two sets is the overlap between them. In this example for the masks for a via first patterning are substantially the same as the masks for the line first patterning and are shown in FIG. 4 with the lines, 100, vias, 105, and overlaps, 110, represented similarly.

As devices on semiconductor wafers shrink to sub-micron dimensions and the number of individual components on a chip necessitate ever higher packing densities, the architectural complexity of interconnections continues to grow. The photoresist that is patterned and etched to form the lines can be deposited in the openings created and introduce a variable that is difficult to control when forming the vias in a second etch. Residual photoresist in the bottom of the opening that forms the lines can create an uneven surface that is difficult to focus on. If focus is not accurate then the second formed vias might not have the defined shape sought.

Thus, there remains a need for a method and apparatus for producing optimally shaped lines and vias using dual damascene technology.

SUMMARY OF THE INVENTION

It is therefore an object of the present invention to provide a method for forming lines exclusive of vias using dual damascene technology.

It is a further object of the present invention to provide a mask capable of forming lines exclusive of vias using dual damascene technology.

In accordance with the above listed and other objects, we provide a method of forming a dual damascene pattern, comprising the steps of:

a) Depositing a layer of a first non-conductive material;

b) Depositing a layer of photoresist on the first layer of the non-conductive material;

c) Exposing the layer of photoresist to a first mask, the first mask defining a first mask pattern of lines and vias, the first mask pattern having two portions, a first portion of the first mask defining the lines and a second portion of the first mask defining the vias, wherein only the first portion of the first mask pattern is transferrable to the photoresist;

d) Etching the layer of first non-conductive material according to the pattern transferred to the photoresist by first mask in step c;

e) Exposing the layer of photoresist to a second mask, the second mask defining a pattern of vias, the second mask pattern having a first portion of the second mask, the first portion of the second mask defining the vias, wherein the first portion of the second mask pattern is transferrable to the photoresist;

f) Etching the layer of first non-conductive material to the pattern transferred to the photoresist in step e.

BRIEF DESCRIPTION OF THE DRAWINGS

These and other features, aspects, and advantages will be more readily apparent and better understood from the following detailed description of the invention, in which.

DETAILED EMBODIMENT

The instant invention describes a method of forming lines vias that incorporates most of the reduced processing complexity benefits that dual damascene formation protocol afford. Additionally, the instant invention solves some of the significant lingering problems associated with line first dual damascene processing. By line first dual damascene processing it is meant a dual damascene processing where the line portion of the current level is formed first and then the via portion. It should be noted that the method of the instant invention is operable in a via first dual damascene processing scheme.

Figure 1:
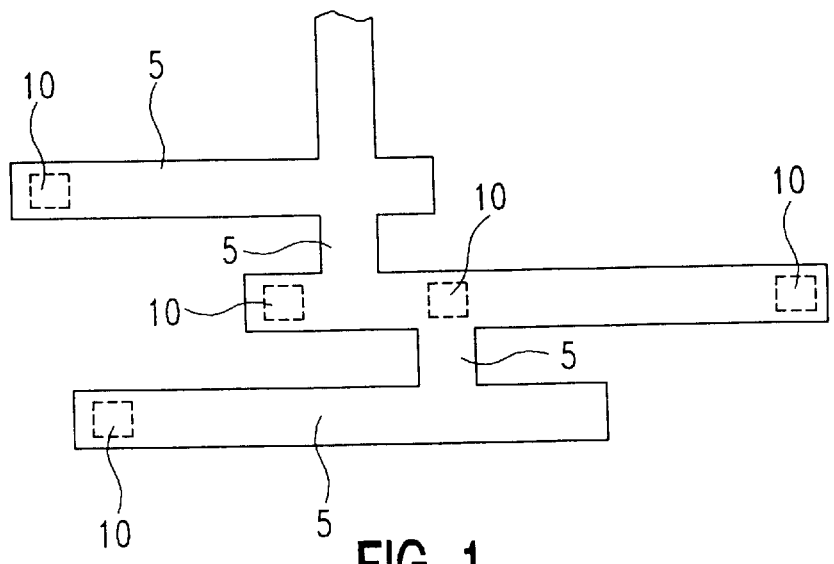
FIG. 1 is a top down view of a typical line/via formation.
Figure 2:
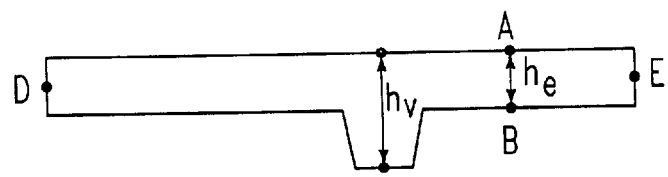
FIG. 2 is a cross sectional view of typical line/via formation.

Considering the final line/via formation desirable using the instant invention from a top down view as shown in FIG. 1 for illustration purposes only, the lines, 5, to be formed on the current level are distinguished from the vias, 10. The lines form intra-level electrical pathways and the vias form inter-level electrical pathways. The instant invention divides the lines and vias to be formed into two groups, which are to be formed separately. Although the method of the instant invention is applicable for line or via first dual damascene applications, the examples are given for a line first deposition scheme. Given a cross-sectional view of a generic line/via configuration as shown in FIG. 2 one of the distinguishing characteristics of this invention is shown. In FIG. 2, the etching depth of a line is defined as the depth from the surface to the bottom of the trench formed to the surface, the distance from point A to point B. The etching height of the via is also defined as the depth from the surface to the bottom the via as formed, the distance from point A to point C. Traditionally, the etching height of the via would be from point B to point C since part of the depth of the via (A to B) would have been etched during the step that etched the line from A to B.

Figure 3:
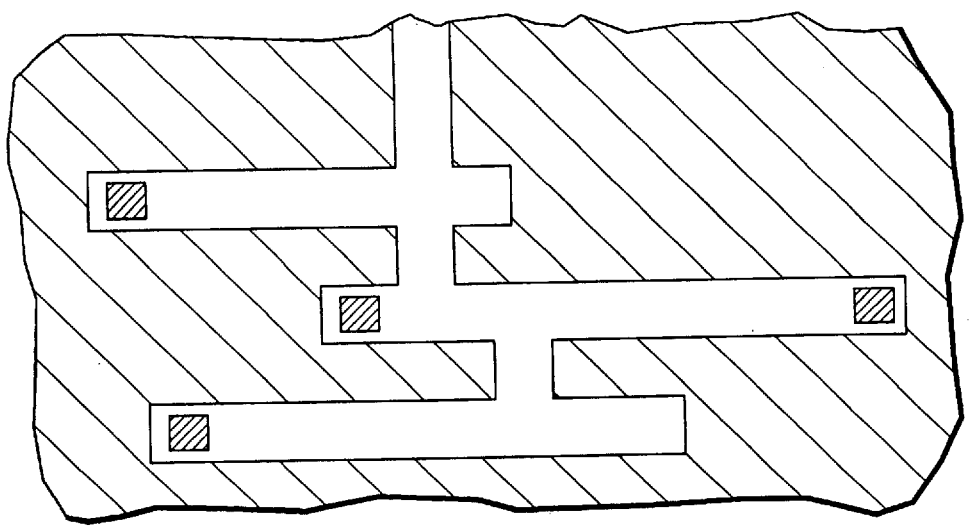
FIG. 3 is a top down view of a mask used to implement the method of the instant invention.

In the instant invention substantially none of the via portion being formed is etched during the etch of the line portion. The mask used during the etch of the line portion would be constructed such that any area that overlaps line and via would be "blacked out", that is to say that any overlapping portion would not print. The mask used to print the line could look like the representation of a mask given in FIG. 3 where the hash marked area represents portions of the mask which do not print onto the photoresist. It should be noted that although via portions to be etched do not print during the line etching, the line etching mask can still be considered to "define" the via areas.

When performing the method using the mask design of the instant invention, first an interlayer of dielectric is deposited. The layer of dielectric would be about 6,000 to about 8,000 Å for a standard layer and about 15,000 to about 19,000 Å for a Fatwire layer. Preferably, the dielectric material would be a low dielectric material having a dielectric constant of at most 4.5. In a more preferred embodiment the dielectric material would be silicon dioxide. In an even more preferred embodiment, a layer of material would be deposited prior to the interlayer of dielectric to insure that underlying metals did not contact any of the etchants or photoresists deposited during the processing of this the current processing level. The layer should be at least about 200 Å. In a most preferred embodiment the layer would comprise silicon nitride and would be about 500 Å.

Figure 4B:
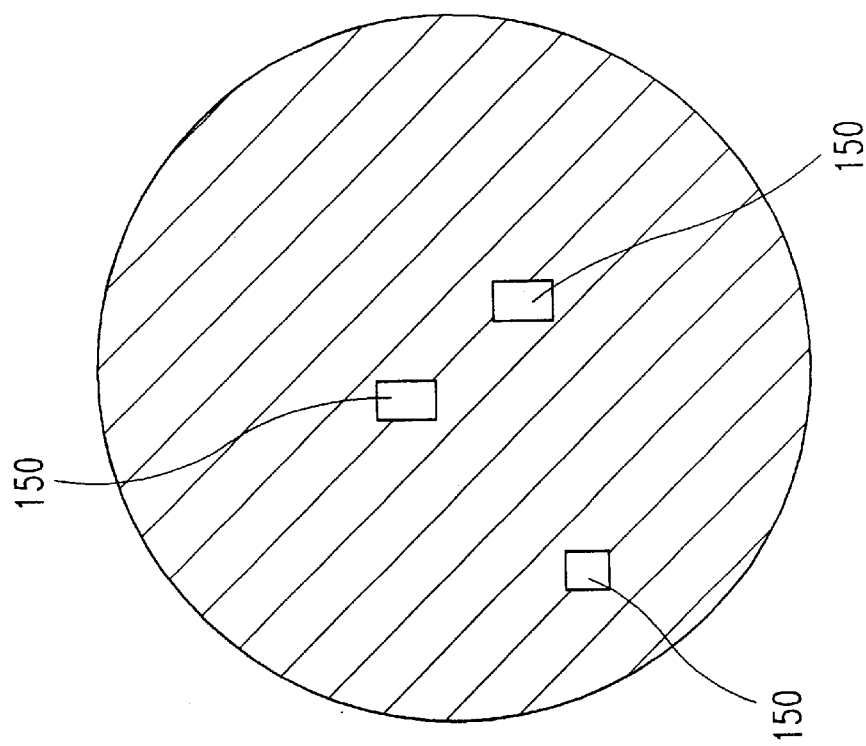
FIGS. 4a and 4b, are top down views of the imaged area obtained using the masks of the instant invention.
Figure 4A:
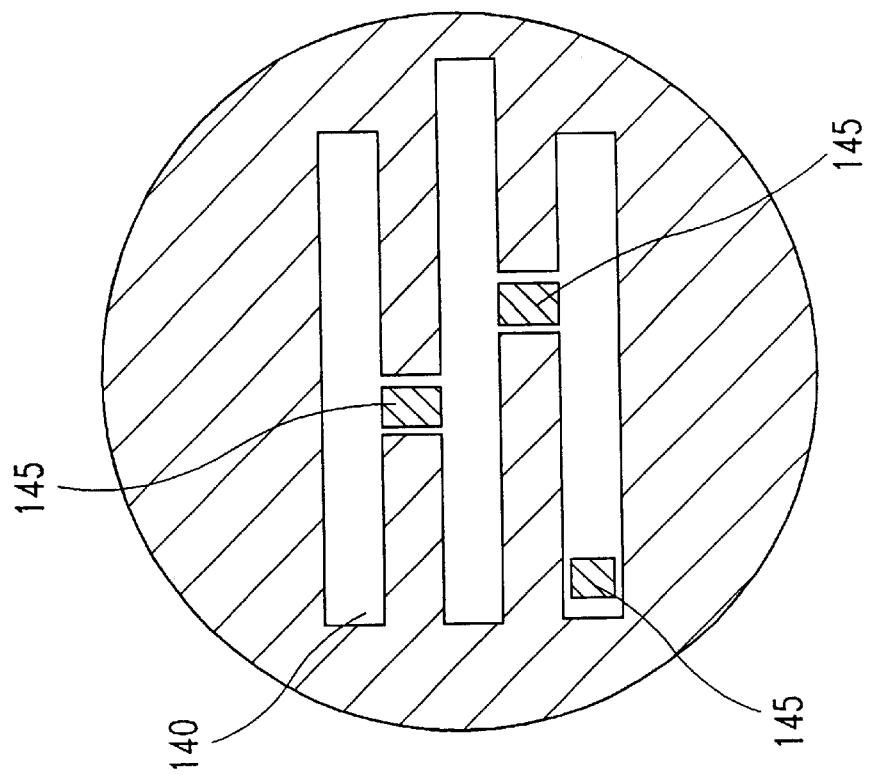

The line portion of the current processing layer would then be exposed and etched using a mask which would expose only those portions exclusively associated with the lines, 40, as shown in FIG. 4a. Using photolithography and positive photoresist, the image for the lines is "printed" into the photoresist. The areas defining vias, 145, which overlap with the areas defining the lines and are not exclusively associated with the lines, appear as dark regions and are not printed.

Figure 5B:
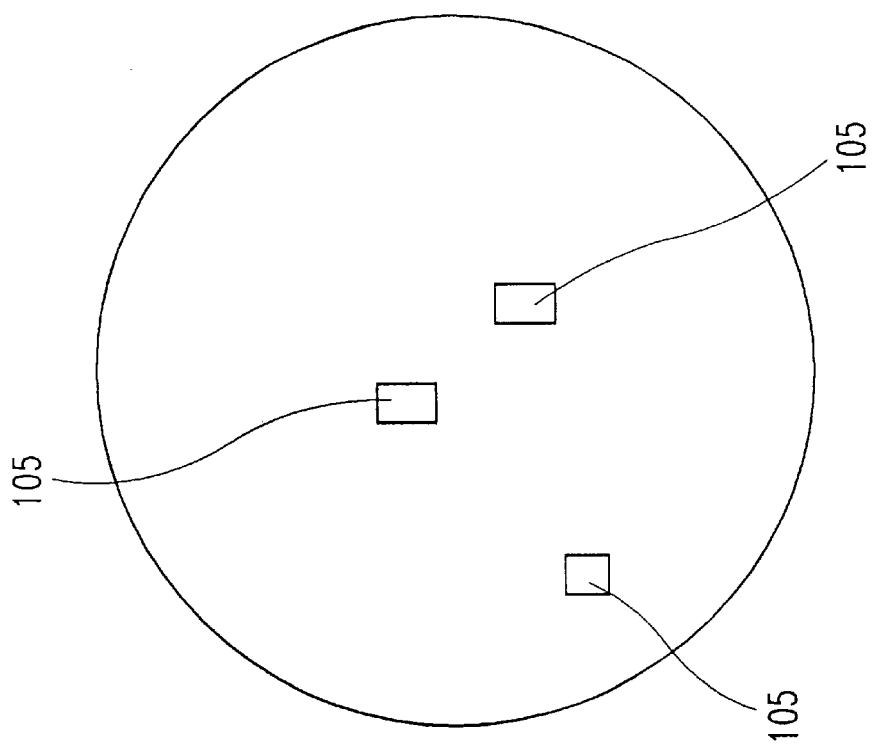
FIGS. 5a and 5b are top down representative views of the patterns on a mask of the instant invention.
Figure 5A:
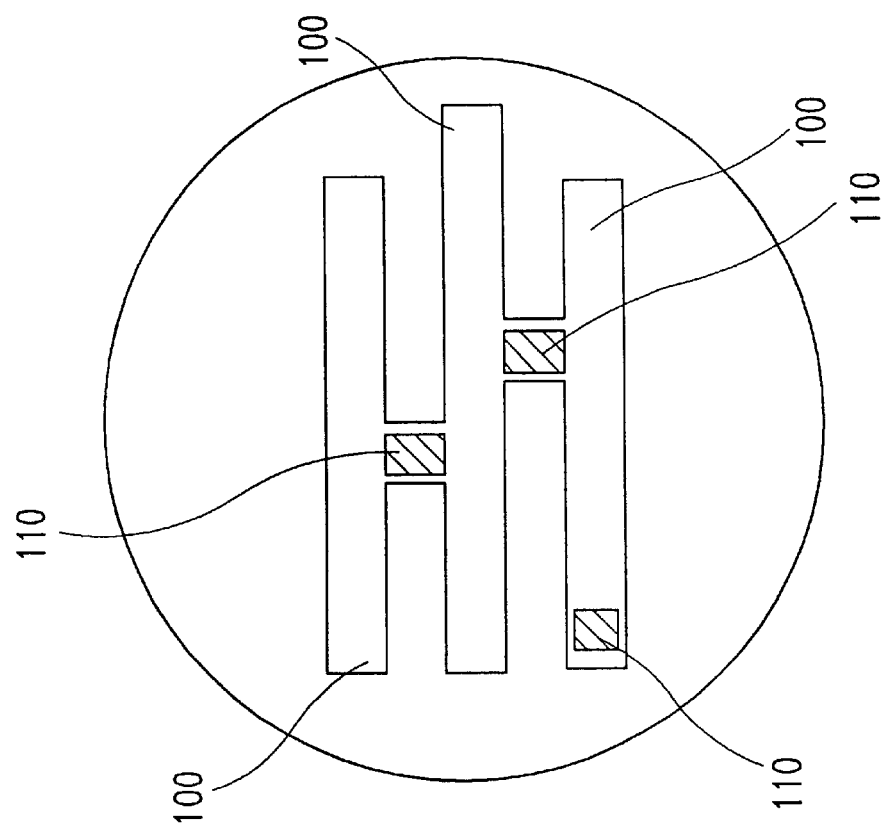

Once the line portion has been defined and etched, the same must be done with the via. A second mask, as shown in FIG. 5b, is introduced which defines only the via portions, 150, of the current processing layer. Since the photoresist being exposed is planarized at the surface and is planar with the rest of the undeveloped portions of the layer imaging is easier. Substantially none of the problems associated with etching a via from the depth of the recently etched line exist. There is little chance of photoresist or other residue creating a non-planar surface that is more difficult to print and/or etch. The second mask is also partially self aligning. Since the light intensity will be focused for maximizing exposure of the via which is planar with the unexposed surroundings, additional exposure of the line region already etched will be minimized because the previously exposed line region will be out of focus. The via would then be etched. In a preferred embodiment, each of the etch steps would be a reactive ion etch (RIE). Each of the steps supra was accomplished using commercially available instruments and mask substrates designed for photolithographic and etching semiconductor materials.

While the invention has been described in terms of specific embodiments, it is evident in view of the foregoing description that numerous alternatives, modification and variations will be apparent to those skilled in the art. Thus, the invention is intended to encompass all such alternatives, modifications and variations which fall within the scope and spirit of the invention and the amended claims. We claim a method of forming a dual damascene pattern, comprising the steps of:

g) Depositing a layer of a first non-conductive material;

b) Depositing a layer of photoresist on the first layer of the non-conductive material;

c) Exposing the layer of photoresist to a first mask, the first mask defining a first mask pattern of lines and vias, the first mask pattern having two portions, a first portion of the first mask defining the lines and a second portion of the first mask defining the vias, wherein only the first portion of the first mask pattern is transferrable to the photoresist;

d) Etching the layer of first non-conductive material according to the pattern transferred to the photoresist by first mask in step c;

e) Exposing the layer of photoresist to a second mask, the second mask defining a pattern of vias, the second mask pattern having a first portion of the second mask, the first portion of the second mask defining the vias, wherein only the first portion of the second mask pattern is transferrable to the photoresist;

f) Etching the layer of first non-conductive material according to the pattern transferred to the photoresist in step e.

What is claimed:

1. A method of forming a dual damascene pattern in a dielectric layer, comprising the steps of:

a) Depositing a layer of a first non-conductive material;

b) Depositing a layer of photoresist on a top surface of said layer of said first non-conductive material;

c) Exposing said layer of photoresist through a first mask pattern of a set of lines minus the intersection of said set of lines and a set of vias;

d) Etching said layer of said first non-conductive material according to the pattern transferred to the photoresist in step c;

e) Exposing the layer of photoresist on said top surface through a second mask pattern containing only the intersection of said set of lines and said set of vias, and f) Etching said layer of first non-conductive material according to the pattern transferred to the photoresist in step e.

2. The method according to claim 1 further comprising the step of depositing a layer of a second non-conductive material prior to the step of depositing the first non-conductive material.

3. The method according to claim 2 wherein in second non-conductive material has a etch selectivity sufficiently different than that of the first non-conductive material such that the etching of the first non-conductive material does not cause significant etching of the second non-conductive material.

4. A method according to claim 1, in which said first mask pattern and said second mask pattern are formed in different masks.

5. A method according to claim 1, in which said trench is etched to a trench depth and said via is etched from said top surface to a via depth greater than said trench depth.

* * * * *